(12) United States Patent
Shiraishi

(10) Patent No.: US 9,800,351 B2
(45) Date of Patent: Oct. 24, 2017

(54) OPTICAL RECEIVING CIRCUIT, OPTICAL TRANSCEIVER, AND CONTROL METHOD FOR OPTICAL RECEIVING CIRCUIT

(71) Applicant: FUJITSU LIMITED, Kawasaki-shi, Kanagawa (JP)

(72) Inventor: Takashi Shiraishi, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/273,073

(22) Filed: Sep. 22, 2016

(65) Prior Publication Data

US 2017/0104545 A1   Apr. 13, 2017

(30) Foreign Application Priority Data

Oct. 7, 2015   (JP) .................................. 2015-199746

(51) Int. Cl.
*H04B 10/69* (2013.01)
*H03F 3/08* (2006.01)

(52) U.S. Cl.
CPC ............. *H04B 10/691* (2013.01); *H03F 3/08* (2013.01)

(58) Field of Classification Search
CPC ................................ H04B 10/691; H03F 3/08
USPC ....................................................... 398/202
See application file for complete search history.

(56) References Cited

U.S. PATENT DOCUMENTS

| 5,347,389 | A   | * | 9/1994  | Skrobko ................... H03F 1/22 250/214 A |
| 7,737,788 | B1  | * | 6/2010  | Roo et al. ................. H03F 1/22 330/253 |
| 2002/0089728 | A1 | * | 7/2002 | Kim .................... H04B 10/6933 398/202 |
| 2003/0021133 | A1 |   | 1/2003 | Ono |
| 2004/0104775 | A1 | * | 6/2004 | Seremeta .................. H03F 1/22 330/310 |
| 2012/0281989 | A1 | * | 11/2012 | Dong et al. .......... H04B 10/693 398/202 |
| 2014/0158866 | A1 |   | 6/2014 | Oku |
| 2015/0233961 | A1 | * | 8/2015 | Bony et al. ............... G01P 5/26 356/28 |

FOREIGN PATENT DOCUMENTS

| JP | 2003-37453  | 2/2003 |
| JP | 2009-246823 | 10/2009 |
| JP | 2014-116851 | 6/2014 |

* cited by examiner

*Primary Examiner* — Dalzid Singh
(74) *Attorney, Agent, or Firm* — Staas & Halsey LLP

(57) ABSTRACT

An apparatus includes a photodiode configured to detect an optical signal; a common-base amplifier configured to input a current signal converted from the optical signal by the photodiode; an common-emitter amplifier configured to couple to an output of the common-base amplifier; a first circuit configured to feed back the output of the common-emitter amplifier to an output of the common-base amplifier; and a second circuit configured to, when power of the optical signal exceeds a predetermined level, reduce a load resistance value of the common-base amplifier and increase an emitter current of the common-emitter amplifier.

16 Claims, 17 Drawing Sheets

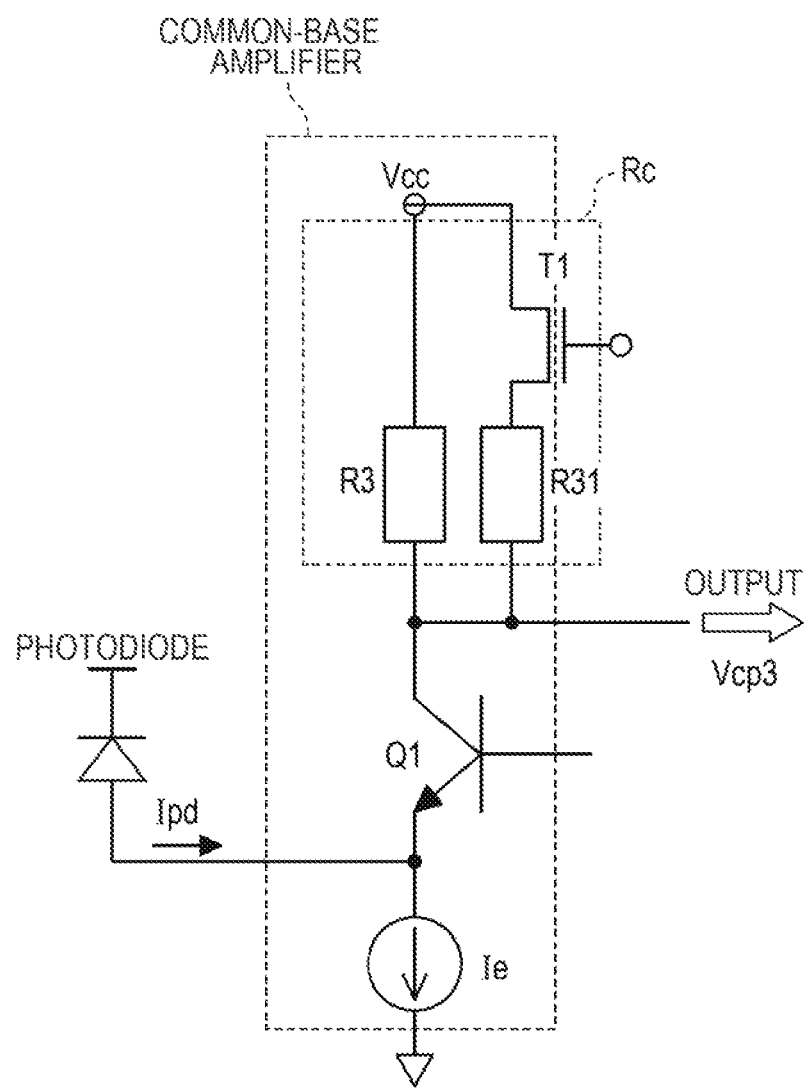

FIG. 4A
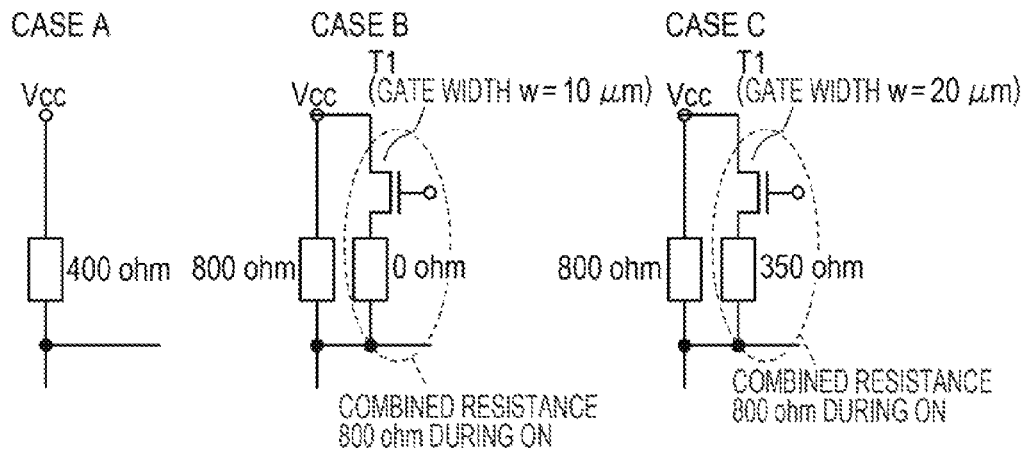
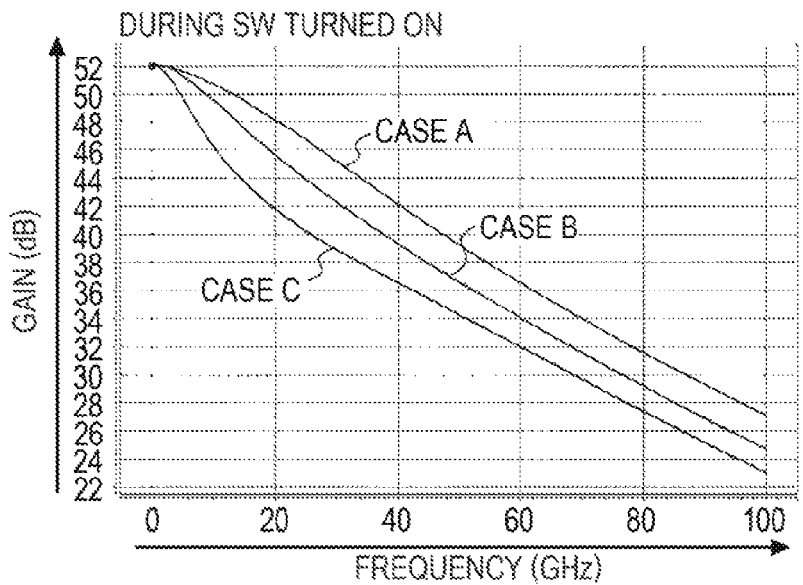
FIG. 4B
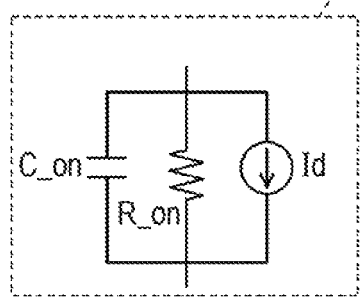

FIG. 5A
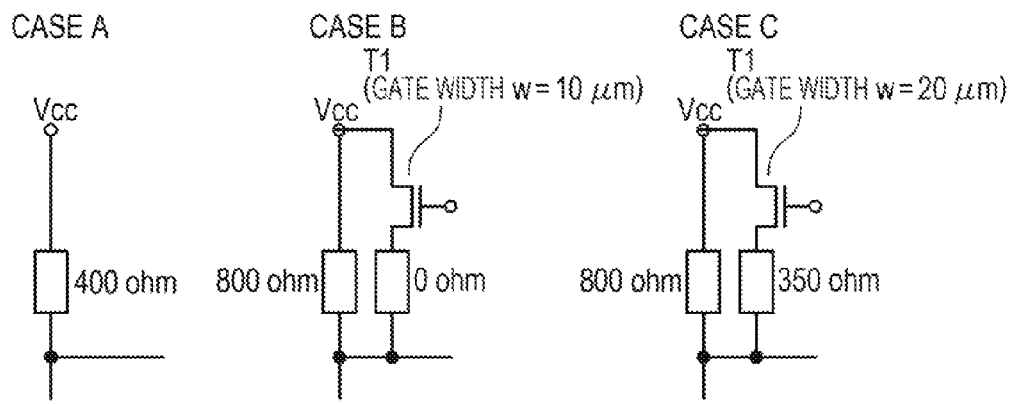
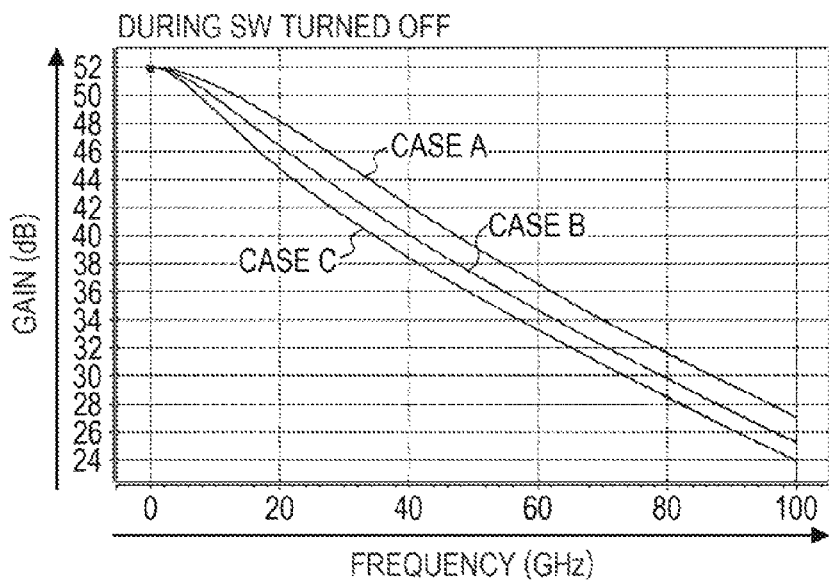
FIG. 5B
EQUIVALENT CIRCUIT WITH T1 TURNED OFF
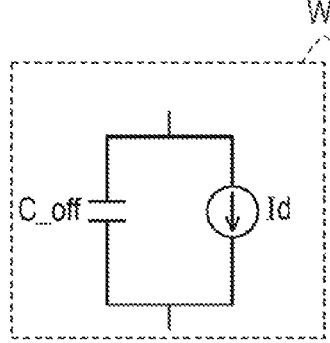

$$Vout = \frac{R23}{R21}(Op\_dc - Vth0)$$

OPTICAL RECEIVING CIRCUIT, OPTICAL TRANSCEIVER, AND CONTROL METHOD FOR OPTICAL RECEIVING CIRCUIT

CROSS-REFERENCE TO RELATED APPLICATION

This application is based upon and claims the benefit of priority of the prior Japanese Patent Application No. 2015-199746, filed on Oct. 7, 2015, the entire contents of which are incorporated herein by reference.

FIELD

The embodiment discussed herein is related to an optical receiving circuit, an optical transceiver including the optical receiving circuit, and a control method for the optical receiving circuit.

BACKGROUND

Optical communication systems have been spread in order to realize large-capacity and high-speed information communications. Optical communication has been spreading not only for long-distance communication, but also as internal data communication method for a server and a supercomputer. In particular, optical interconnect for connecting boards or chips by optical wiring instead of the electric wiring in the past has been attracting attention. In an optical receiving circuit disposed at a reception-side front end of optical communication, a received optical signal is detected as an electric current by a light receiving element such as a photodiode. A trans-impedance amplifier (TIA) converts a signal of the detected electric current into a voltage signal, and amplifies the voltage signal to voltage amplitude suitable for analog-digital conversion in the next stage.

FIG. 1A illustrates a configuration of a general optical receiving circuit. A common-base amplifier is used as a preamplifier of the TIA. In the common-base amplifier, a noise-reduction effect is obtained by increasing a load Rc on a collector side. In FIG. 1, circuit noise is represented by Expression (1).

$$\overline{i_{conv}^2} = \overline{i_{bc}^2} + \frac{\overline{v_a^2}}{R_C^2} + \overline{i_a^2} \quad (1)$$

A first term on the right side of Expression (1) represents a noise current in terms of input. A second term and a third term on the right side represent an input noise current of a post-stage amplifier. The second term represents a thermal noise component (current) from the load Rc, which is obtained by dividing a noise voltage (the square of a voltage) to the post-stage amplifier by the square of a resistance value of the load Rc. It is possible to reduce an input noise component of the second term by increasing the resistance value of the load Rc.

However, if optical input power, that is, an input current Ipd to the common-base amplifier is large, the load Rc with a large resistance value makes a potential Vcp3 in an output node so large that the post-stage amplifier may not normally operate. As illustrated in FIG. 1B, this problem is more conspicuous when the resistance value of the load Rc is larger. This is because a voltage drop in the load Rc decreases corresponding to the increase in the resistance value and the potential Vcp3 increases exceeding an appropriate range.

Since a rise in the potential Vcm during an input of large optical power may cause a failure of DC potential, there is known a configuration for switching the load resistors 214 and 215 together with the voltage sources Vdd4 and Vdd5 as illustrated in FIG. 1C in order to reduce such a failure of the DC potential (see, for example, Japanese Laid-open Patent Publication No. 2009-246823).

Meanwhile, there is known a configuration for increasing a bias current on an emitter side of the common-base amplifier when an input current from the photodiode increases, thereby keeping a dynamic range of a differential amplifier circuit unchanged (see, for example, Japanese Laid-open Patent Publication No. 2003-037453).

In addition, there is known a configuration for connecting a common-emitter amplifier circuit to an output of the common-base amplifier to form a negative feedback loop (see, for example, Japanese Laid-open Patent Publication No. 2014-116851).

SUMMARY

According to an aspect of the embodiments, an apparatus includes a photodiode configured to detect an optical signal; a common-base amplifier configured to input a current signal converted from the optical signal by the photodiode; an common-emitter amplifier configured to couple to an output of the common-base amplifier; a first circuit configured to feed back the output of the common-emitter amplifier to an output of the common-base amplifier; and a second circuit configured to, when power of the optical signal exceeds a predetermined level, reduce a load resistance value of the common-base amplifier and increase an emitter current of the common-emitter amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a configuration diagram in which a switching circuit is used in a load on a collector side of the common-base amplifier;
FIG. 4A is a diagram for explaining a problem of a switch capacity at the time when a transistor T1 is on;
FIG. 4B is an equivalent circuit at the time when the transistor T1 is on;
FIG. 5A is a diagram for explaining a problem of a switch capacity at the time when the transistor T1 is off;
FIG. 5B is an equivalent circuit at the time when the transistor T1 is off;

DESCRIPTION OF EMBODIMENT

An embodiment is explained below with reference to the drawings.

In FIG. 2, during a large current input, which is a state where noise is less problematic, a low voltage (e.g., 0 V) is applied to the gate of a PMOS transistor T1 to turn on the PMOS transistor T1, so that Loads R3 and R31 are connected in parallel to reduce a resistance value of the load Rc (combined resistance). Consequently, the voltage drop in the load Rc is increased to suppress the potential Vcp3. When an input current is small, a high voltage (e.g., Vcc) is applied to the gate of the PMOS transistor T1 to turn off the PMOS transistor T1. In this case, the resistance value of the load Rc is a resistance value of the load R3 and a noise reduction effect is exhibited.

In the configuration illustrated in FIG. 2, when the load resistance of the common-base amplifier is reduced during a large signal, the capacity of the PMOS transistor T1 appears to be the load of the common-base amplifier, a band characteristic at a point of the potential Vcp3 is sometimes deteriorated. The inventor found that deterioration in operation performance of the common-base amplifier having the switching configuration illustrated in FIG. 2 is more conspicuous in a high-frequency band exceeding 20 GHz. Therefore, it is desired to provide an optical reception frontend technique for compensating for band deterioration in an output node of a common-base (or gate) amplifier and realizing a wide-band and stable operation irrespective of the magnitude of input power.

First, deterioration in performance in a high-frequency band at the time when a common-base amplifier 20 having a load configuration illustrated in FIG. 2 is used alone in an optical receiving circuit is explained with reference to FIGS. 3, 4A and 4B, and 5A and 5B.

Figure 3:
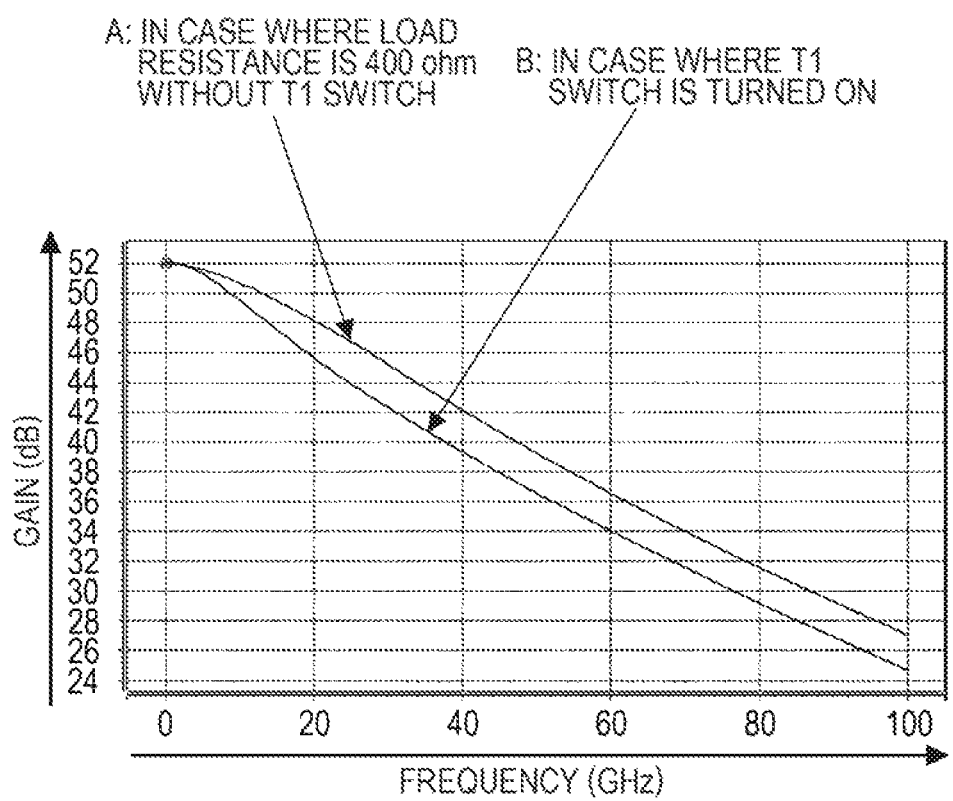
FIG. 3 is a diagram for explaining deterioration of an operation in a high-frequency band in a configuration illustrated in FIG. 2.

In the common-base amplifier 20 illustrated in FIG. 3, a value of the resistance of a load Rc on a collector side of a transistor Q1 is adjusted by switching, with a PMOS transistor T1, a connection relation between loads R3 and R31 disposed in parallel. A graph on the right side of FIG. 3 illustrates a simulation result obtained by comparing an output characteristic of the common-base amplifier 20 at the time when the PMOS transistor T1 is turned on to reduce the load Rc with an output characteristic at the time when a fixed load without switching is used. As conditions of the simulation, the resistance of the load R3 is 800Ω, the resistance of the load R31 is 800Ω, and the combined resistance of the load Rc at the time when the transistor T1 is on is 400Ω. The simulation result is indicated by a line B. As comparison, the output characteristic at the time when the fixed load of 400Ω is used is indicated by a line A.

When the load of the switching configuration is used (the line B), deterioration in a gain appears when operation speed exceeds several gigahertz (GHz) compared with when the fixed load is used (the line A). The difference becomes conspicuous when the operation speed exceeds 20 GHz. This is because the capacity of the transistor T1 adversely affects a high-speed operation. In order to reduce the capacity of the transistor T1, it is conceivable to reduce the size of the transistor T1.

FIG. 4A is simulation results of two cases of a fixed load and a reduced sizes of the transistor T1 and at a switch-on time. As in FIG. 3, output characteristics (a case B and a case C) of the common-base amplifier including the load of the switching configuration are compared with an output characteristic (a case A) at the time when the fixed load of 400Ω is used. Gate width of the transistor T1 of the case B is 10 µm and gate width of the transistor T1 of the case C is 20 µm.

A capacity C on during ON of the time when the transistor T1 decreases in proportion to gate width w. Therefore, deterioration is smaller in the case B than the case C. On the other hand, Id of an equivalent circuit illustrated in FIG. 4B is a current source that depends on a voltage Vds between a drain and a source of the transistor T1 and appears as ON resistance Ron. The ON resistance Ron is approximately in a proportional relation with 1/w. The ON resistance Ron increases as the gate width w decreases. In the case C (w=20 µm), the ON resistance Ron is 450Ω and the resistance of the load R31 is set to 350Ω. However, in the case B (w=10 µm), the ON resistance Ron increases to 800Ω and the resistance of the resistor R31 decreases to 0Ω. In this way, when the gate width w of the transistor T1 is reduced to reduce the capacity, the ON resistance Ron increases. It is difficult to design an appropriate combined load.

FIG. 5A is a diagram for explaining a problem of a switch capacity at the time when the transistor T1 is off. FIG. 5B is an equivalent circuit at the time when the transistor T1 is off. As in FIG. 4A, in a case A, the fixed load of 400Ω is used without switching. In a case B and a case C, the combined resistance of the transistor T1 and the load 31 at the ON time is designed to be 800Ω (combined resistance in an entire load circuit is 400Ω).

When the transistor T1 is off, deterioration in the output characteristic in the high-frequency band is small compared with when the transistor T1 is on in FIG. 4A. This is because, when the transistor T1 is on, not only the capacity of a board but also a depletion layer capacity is seen because charges accumulate in the transistor T1. However, even when the transistor T1 is off, deterioration in the operation in the high-frequency band occurs compared with the case A.

From the results illustrated in FIGS. 3 to 5A, when the load resistor of the switch configuration is used in a common-base (or gate) amplifier (hereinafter simply referred to as "common-base amplifier"), it is desired to maintain, in particular, a high-speed characteristic during switch-on.

In the embodiment, an output Vcp3 of the common-base amplifier is connected to an input of a common-emitter (or source) amplifier (hereinafter simply referred to as "common-emitter amplifier") to make it possible to adjust a current amount on an emitter side of the common-emitter amplifier. During a large current when noise less easily causes a problem, the load resistance of the coFR6mmon-base amplifier is reduced and an emitter current of the common-emitter amplifier is increased to control an output of the common-emitter amplifier to be returned to the output Vcp3 by negative feedback. Consequently, a rise in the potential of the output Vcp3 of the common-base amplifier during the large current input is suppressed and a feedback output of the common-emitter amplifier is caused to follow the output Vcp3 to compensate for band deterioration in the output Vcp3. Details of the configuration and the operation are explained below.

Figure 6:
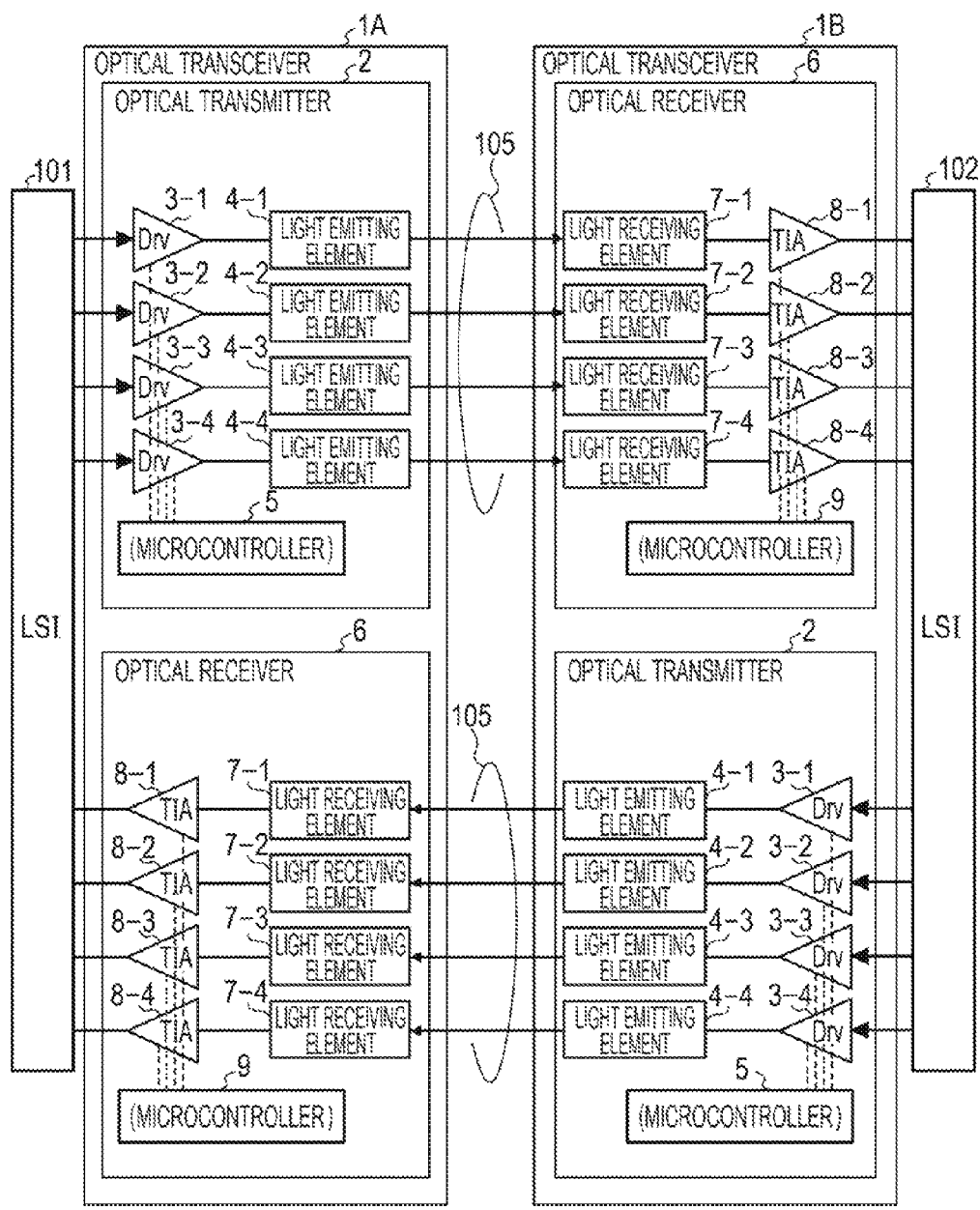
FIG. 6 is a schematic diagram of an optical interconnect to which an optical receiving circuit in an embodiment is applied.

FIG. 6 illustrates an example of optical interconnect to which the optical receiving circuit of the embodiment is applied. In the example illustrated in FIG. 6, LSIs (Large-scaled Integration) 101 and 102 are connected using a four-channel optical cable 105 and optical transceivers 1A and 1B. The LSIs 101 and 102 are, for example, LSIs of a network interface card that connects servers or LSIs of an HCA (Host Channel Adapter) of an InfiniBand.

The optical interconnect includes an optical transmitter 2, an optical receiver 6, and an optical cable 105 that connects the optical transmitter 2 and the optical receiver 6. The optical transmitter 2 includes light emitting elements 4-1 to 4-4 corresponding to channels, drivers 3-1 to 3-4 that drive the light emitting elements 4-1 to 4-4, and a microcontroller 5 that controls the drivers 3-1 to 3-4. The light emitting elements 4-1 to 4-4 may include, for example, a semiconductor laser diode and an optical modulator.

The optical receiver 6 includes light receiving elements 7-1 to 7-4 (hereinafter collectively referred to as "light receiving elements 7") such as photodiodes, trans-impedance amplifiers (TIAs) 8-1 to 8-4 (hereinafter collectively referred to as "TIAs 8"), and a microcontroller 9. The light receiving circuit in the embodiment includes the light receiving elements 7 and the TIAs 8 and has a characteristic in circuits of front portions of the TIAs 8 connected to the light receiving elements 7.

In the optical transceivers 1A and 1B, for example, the TIAs 8-1 to 8-4 and the drivers 3-1 to 3-4 may be formed on one chip. The chip may be mounted on an optical wiring board on which the light receiving elements 7-1 to 7-4 and the light emitting elements 4-1 to 4-4 are formed. In this case, each of the optical transceivers 1A and 1B is formed as one optical module.

<Circuit Configuration Example 1>

Figure 7:
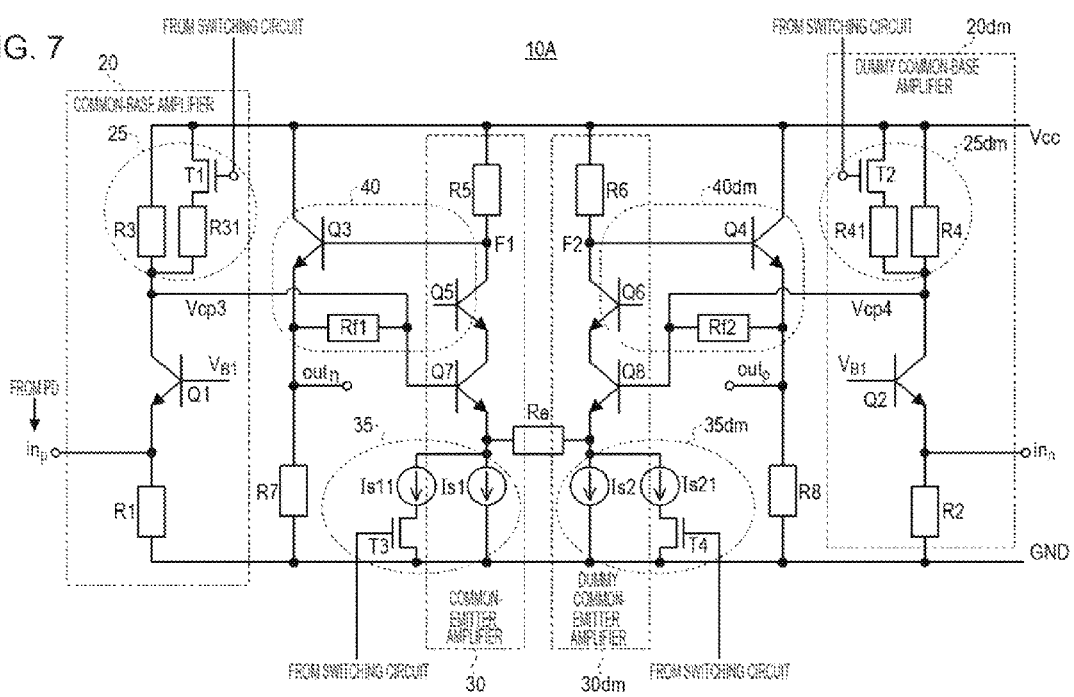
FIG. 7 is a diagram illustrating a circuit configuration example 1 of a frontend amplifier circuit used in the optical receiving circuit in the embodiment.

FIG. 7 illustrates a configuration example of a frontend amplifier circuit 10A included in the optical receiving circuit in the first embodiment. The frontend amplifier circuit 10A includes a common-base amplifier 20, a common-emitter amplifier 30, a dummy common-base amplifier 20dm for a differential motion, and a dummy common-emitter amplifier 30dm. The configurations of the dummy common-base amplifier 20dm and the dummy common-emitter amplifier 30dm are the same as the configurations of the common-base amplifier 20 and the common-emitter amplifier 30. Polarities of inputs and outputs are opposite phases. The frontend amplifier circuit 10A illustrated in FIG. 7 is formed as a differential amplifier. However, the optical receiving circuit in the embodiment is not limited to a differential configuration.

The common-base amplifier 20 includes a transistor Q1. An emitter of the transistor Q1 is connected to the light receiving elements (the photodiodes) 7. More specifically, outputs of the photodiodes 7 are connected to a positive input $in_p$ of the common-base amplifier 20 as current signals. The positive inputs $in_p$ and the emitter of the transistor Q1 are connected. The emitter of the transistor Q1 is connected to reference potential GND via a load R1. A constant current source may be used instead of the load R1. A base of the transistor Q1 is connected to fixed potential $V_{B1}$. A collector of the transistor Q1 is connected to the power supply voltage Vcc via a load 25.

The load 25 includes the resistors R3 and R31 disposed in parallel and a switching transistor T1 connected to one resistor R31 in series. A switch signal is input to a gate of the switching transistor T1 from a switching circuit explained below.

The potential of the output Vcp3 of the common-base amplifier 20 is extracted from a node between the collector of the transistor Q1 and the load 25 and input to the common-emitter amplifier 30.

The common-emitter amplifier 30 includes a transistor Q7. The output Vcp3 of the common-base amplifier 20 is connected to a base of the transistor Q7. An emitter of the transistor Q7 is connected to a current source 35. A collector of the transistor Q7 is connected to a negative output $OUT_n$ to the post-stage amplifier. The collector of the transistor Q7 is connected to the power supply voltage Vcc via a load R5.

The current source 35 includes current sources Is1 and Is11 disposed in parallel and a switching transistor T3 connected to one current source Is11 in series. A switch signal is input to a gate of the switching transistor T3 from the switching circuit explained below.

An output of the common-emitter amplifier 30 is extracted from a node F1 between the collector of the transistor Q7 and the load R5. The output of the common-emitter amplifier 30 is fed back to the output Vcp3 (by negative feedback) via a transistor Q3 and a feedback resistor Rf1. The collector of the transistor Q7, the transistor Q3, the feedback resistor Rf1, and the base of the transistor Q7 form a feedback circuit 40. An emitter of the transistor Q3 is connected to the reference potential GND via a resistor R7. A constant current source may be used instead of the resistor R7.

In FIG. 7, a transistor Q5 is cascode-connected to the collector of the transistor Q7. An output from the node F1 turns on the transistor Q3 and is fed back to the output Vcp3. The transistor Q5 is inserted to stabilize a feedback operation and efficiently perform amplification.

A resistor Re connected to the emitter of the transistor Q7 is used to adjust a gain specified by R5/Re. When the resistor Re is used, by adjusting a value of the resistor Re, it is possible to adjust a gain without changing the load R5.

Like the common-base amplifier 20, the dummy common-base amplifier 20dm on the negative phase side includes a transistor Q2. An emitter of the transistor Q2 is connected to the negative feedback input $in_n$. The emitter of the transistor Q2 is connected to the reference potential GND via a load R2. A constant current source may be used instead of the load R2. A base of the transistor Q2 is connected to the fixed potential $V_{B1}$. A collector of the transistor Q2 is connected to the power supply voltage Vcc via a load 25dm. The load 25dm includes resistors R1 and R41 disposed in parallel and a switching transistor T2 connected to one resistor R41 in series. A switch signal is input to a gate of the switching transistor T2 from the switching circuit explained below.

An output Vcp4 of the dummy common-base amplifier 20dm is extracted from a node between the collector of the transistor Q2 and the load 25dm and input to the dummy common-emitter amplifier 30dm. The dummy common-emitter amplifier 30dm includes a transistor Q8. The output Vcp4 of the dummy common-base amplifier 20dm is connected to a base of the transistor Q8. An emitter of the transistor Q8 is connected to a current source 35dm. A collector of the transistor Q8 is connected to a positive output $OUT_p$ to the post-stage amplifier. The collector of the transistor Q8 is connected to the power supply voltage Vcc via a load R6.

The current source 35dm includes current sources Is2 and Is21 disposed in parallel and a switching transistor T4 connected to one current source Is21 in series. A switch signal is input to a gate of the switching transistor T4 from the switching circuit explained below.

An output of the dummy common-emitter amplifier 30dm is extracted from a node F2 between the collector of the transistor Q8 and the load R6. The output of the dummy common-emitter amplifier 30dm is fed back to the output Vcp4 via a transistor Q4 and a feedback resistor Rf2. The collector of the transistor Q8, the transistor Q4, the feedback resistor Rf2, and the base of the transistor Q8 form a feedback circuit 40dm. A transistor Q6 cascode-connected to the collector of the transistor Q8 is inserted to stabilize a feedback operation and efficiently perform amplification. The resistor Re connected to the emitter of the transistor Q8 is used to adjust a gain specified by R6/Re. A constant current source may be used instead of a resistor R8 inserted between the transistor Q8 and the GND. The transistors Q4 and Q3 are circuits called emitter follower and have an effect of reducing output impedance. In FIG. 7, fixed resistors are used as the feedback resistors Rf1 and Rf2. However, a feedback configuration including active elements such as MOS transistors or bipolar transistors is also possible.

In FIG. 7, an example of a frontend of a perfect differential configuration is illustrated. However, both of the common-base amplifier and the common-emitter amplifier may be a single configuration or only the common-base amplifier may be the single configuration and the common-emitter amplifier may be a differential configuration.

The operation of the frontend amplifier circuit 10A is explained. Explanation of a half circuit portion is enough for the explanation of the operation. Therefore, the explanation is focused on the common-base amplifier 20 and the common-emitter amplifier 30.

When power of an optical signal received by the optical receiver 6 is large, that is, when a current signal input to the frontend amplifier circuit 10A is a large current, the switching transistor T1 of the common-base amplifier 20 becomes conductive and connects the resistors R3 and R31 in parallel. Consequently, a value of the resistance of the load 25 is reduced to suppress the potential of the output Vcp3 of the common-base amplifier 20 from becoming excessively large. The potential of the output Vcp3 is suppressed enough for not causing failure of the operation of a post-stage circuit. However, the potential of the output Vcp3 is higher than the base potential $V_{B1}$ of the transistor Q1. The potential of the output Vcp3 is applied to the base of the transistor Q7 of the common-emitter amplifier 30. The transistor Q7 becomes conductive.

In a state in which the transistor Q7 is conductive, the switching transistor T3 of the common-emitter amplifier 30 is controlled to be switched to be conductive. According to the conduction of the switching transistor T3, the current sources Is11 and Is1 are connected in parallel and current amounts are totaled. An emitter current of the common-emitter amplifier 30 increases. Consequently, a collector current also increases. An output from the node F1 on the collector side of the common-emitter amplifier 30 makes the transistor Q3 conductive. An electric current flows to the feedback resistor Rf1 and a voltage is generated. The voltage is fed back to the output Vcp3. By increasing the emitter current of the common-emitter amplifier 30 during a large power input, operation speed of the feedback circuit 40 is improved. Followability of the operation of the common-emitter amplifier 30 to the potential of the output Vcp3 is improved. Deterioration in an operation in a high-frequency band (band deterioration) due to ON resistance of the switching transistor T1 is efficiently compensated.

Instead of the current sources Is11 and Is1 of the common-emitter amplifier 30, resistors may be disposed in parallel to perform the switching control. It is possible to reduce the resistance value and increase the emitter current by making the switching transistor T3 conductive when an electric current is large.

Figure 1A:
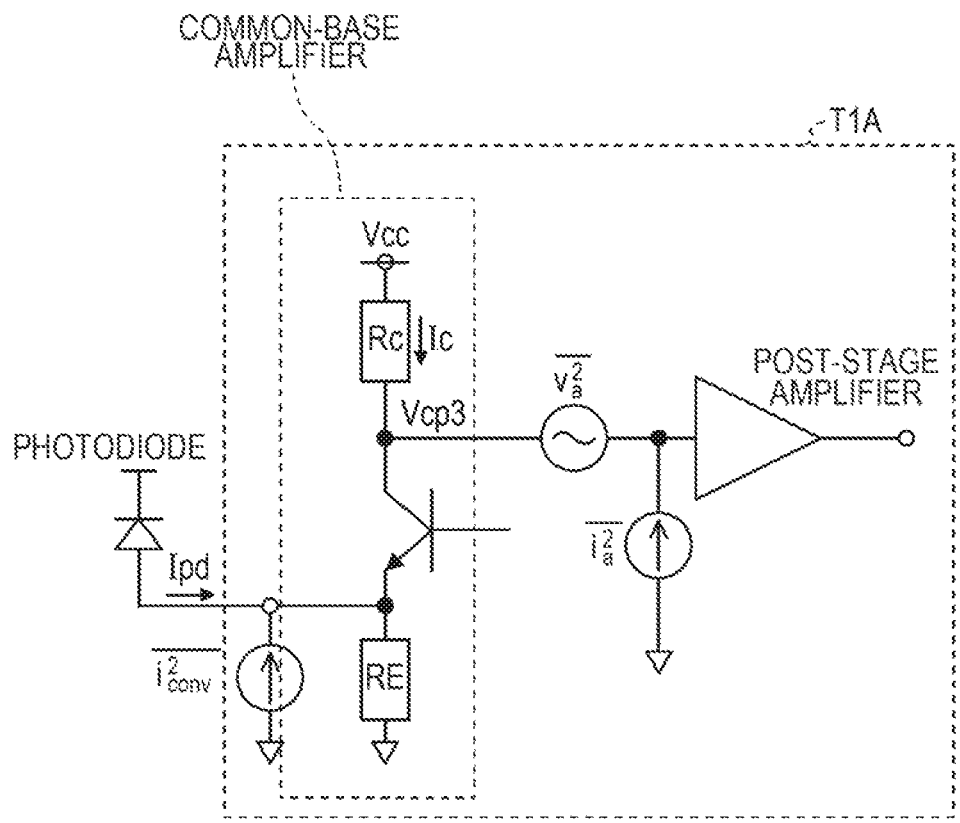
FIG. 1A is a diagram of a general optical receiving circuit.
Figure 1B:
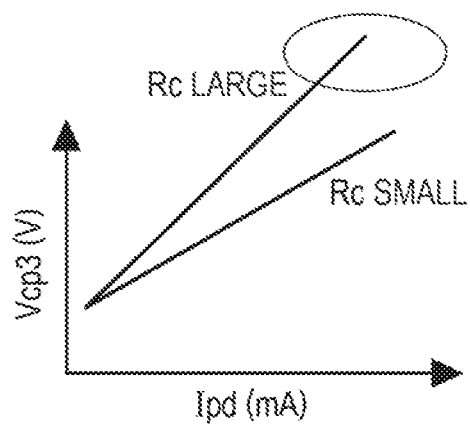
FIG. 1B is a diagram for explaining a relation among a load Rc, an input current Ipd to a common-base amplifier, and potential Vcp3 in an output node.
Figure 1C:
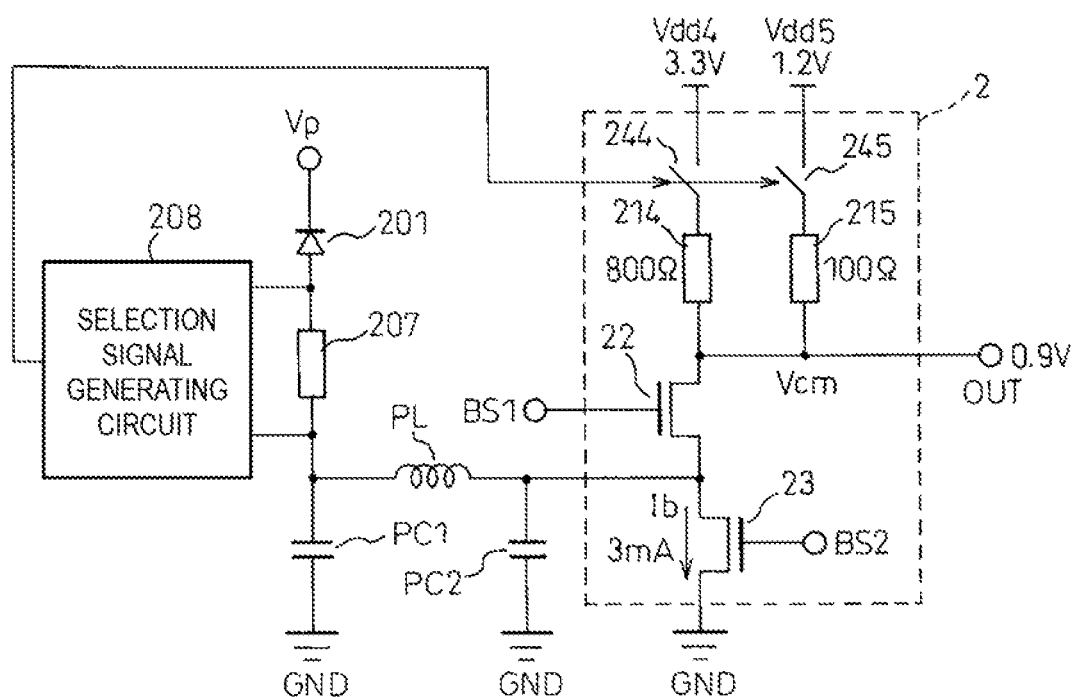
FIG. 1C is a diagram for explaining the TIA circuit.

On the other hand, during small power when noise causes a problem, the switching transistor T1 of the common-base amplifier 20 is made nonconductive to increase the resistance value. Consequently, a reduction in noise is realized as explained with reference to FIG. 1. At this point, the switching transistor T3 of the common-emitter amplifier 30 is nonconductive and the emitter current is Is1. An output from a node F1 on the collector side turns on the transistor Q3. A voltage corresponding to the potential of the output Vcp3 during small power is generated by the feedback resistor Rf1 and fed back to the output Vcp3.

By making a load on the collector side of the common-base amplifier 20 adjustable, circuit oscillation is suppressed even when a large-capacity photodiode (100 to 200 fF) is used. The emitter current of the common-emitter amplifier 30 is made adjustable according to input power. The output of the common-emitter amplifier 30 is fed back to the output Vcp3 of the common-base amplifier 20 with high followability. Consequently, it is possible to maintain a high-speed operation in a high-frequency band and maintain a wide operation band. A noise reduction effect during the small signal is as explained above.

<Circuit Configuration Example 2>

Figure 8:
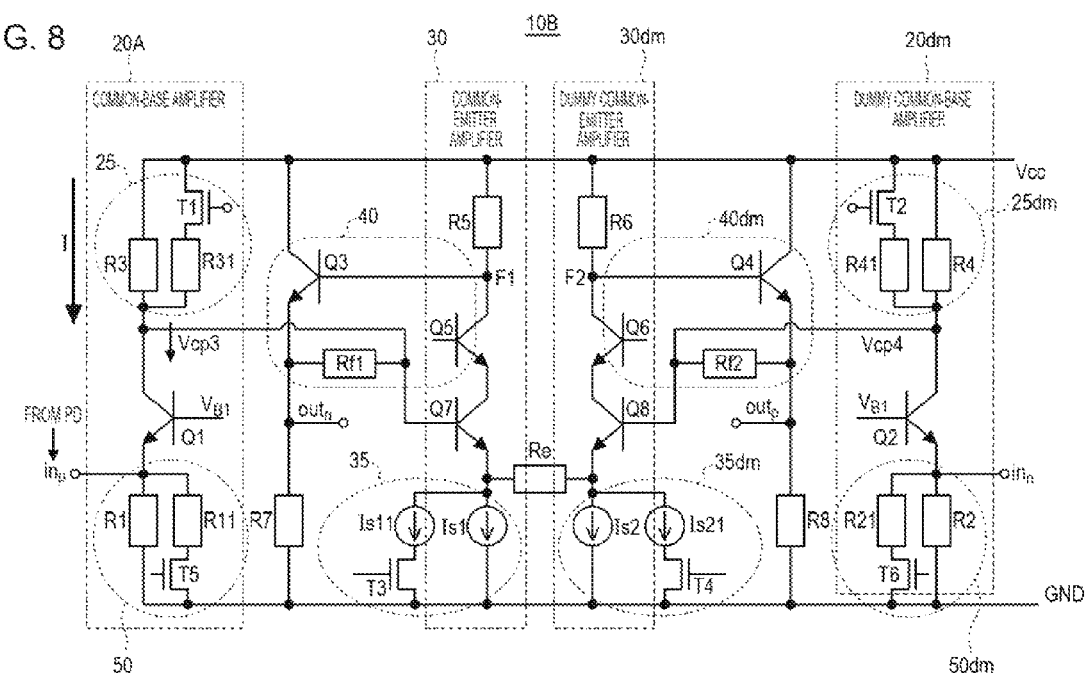
FIG. 8 is a diagram illustrating a circuit configuration example 2 of the frontend amplifier circuit used in the optical receiving circuit in the embodiment.

FIG. 8 illustrates a configuration example of a frontend amplifier circuit 10B used in the optical receiving circuit in the embodiment. The frontend amplifier circuit 10B includes a current adjustment circuit 50 on an emitter side of a common-base amplifier 20A in addition to the circuit configuration illustrated in FIG. 7. The current adjustment circuit 50 adjusts an emitter current amount of the common-base amplifier 20A according to the magnitude of input power. Components same as the components of the frontend amplifier circuit 10A illustrated in FIG. 7 are denoted by the same reference numerals and signs and redundant explanation is omitted.

As explained above, circuit noise may be reduced by increasing the resistance of the load 25 on a collector side of the common-base amplifier 20A during a small power input. However, during small power (a small signal), the potential of the output Vcp3 sometimes excessively decreases and an operation fails. An improved configuration during the small power input is explained with reference to FIGS. 9 and 10.

Figure 9:
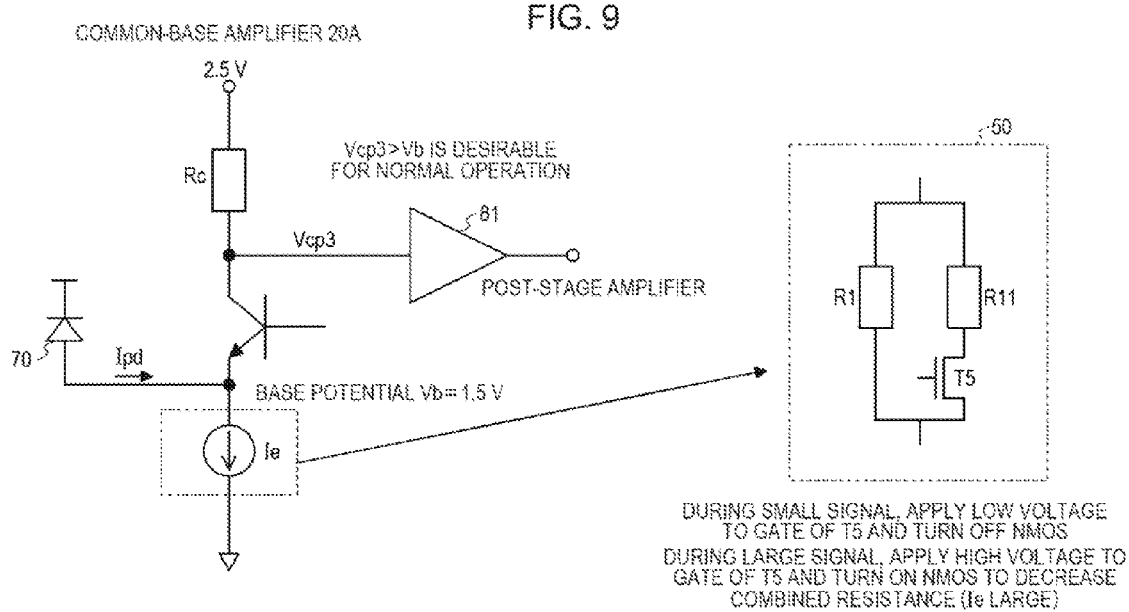
FIG. 9 is a diagram for explaining current adjustment on an emitter side of a common-base amplifier in the circuit configuration illustrated in FIG. 8.

In FIG. 9, when an input Ipd from a photodiode 70 is a small current, a resistance value of the load Rc is fixed to the resistance of the load R3 (see FIG. 8) for the purpose of a noise reduction (R3>R3×R31/(R3+R31)). As illustrated in FIG. 7, when the load R1 connected to the emitter of the transistor Q1 is fixed, the load R1 may be regarded as a fixed constant current source. An electric current Ie on the emitter side is fixed.

Figure 10:
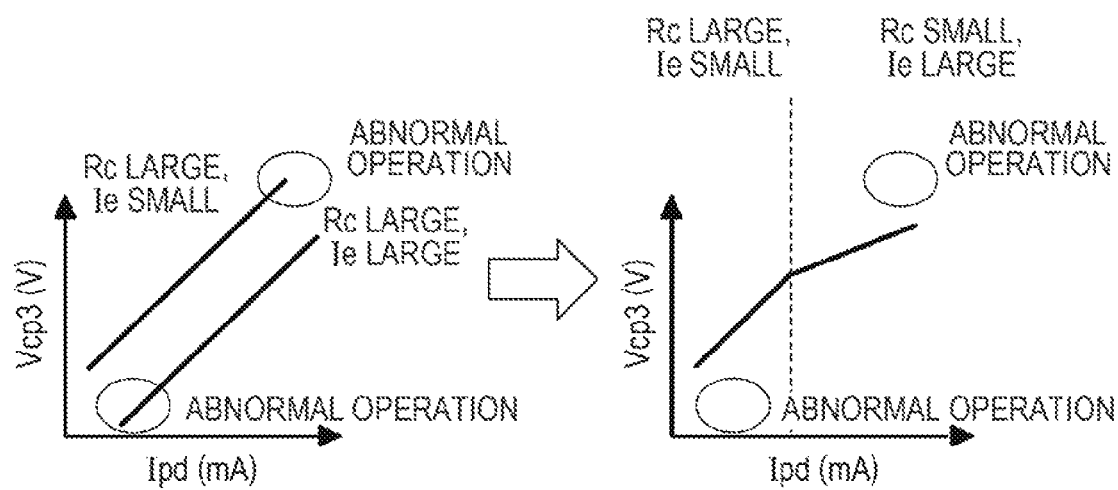
FIG. 10 is a diagram for explaining current adjustment on the emitter side of the common-base amplifier.

As illustrated in a figure on the left side of FIG. 10, the resistance of the load Rc on the collector side increases when the input current Ipd is large (during large power input) and the electric current Ie on the emitter side is small (i.e., the resistance on the emitter side is large), the potential of the output Vcp3 excessively increase and the operation fails. When the resistance of the load Rc on the collector side is large, by increasing the electric current Ie on the emitter side (i.e., reducing the resistance of the load R1), it is possible to suppress the potential of the output Vcp3 from excessively increasing during the large current. However, it is likely that the potential of the output Vcp3 excessively decreases in a small current time region (Vcp3=R1/(R1+R3)) and causes an abnormal operation.

Therefore, as illustrated in a figure on the right side of FIG. 10, during the small power input, the resistance of the load Rc on the collector side is increased to reduce circuit noise and the electric current on Ie on the emitter side is reduced to reduce an excessive decrease in the potential of the output Vcp3. During the large power input, the resistance of the load Rc on the collector side is reduced and the electric current Ie on the emitter side is increased to suppress the potential of the output Vcp3 from excessively increasing.

Referring back to FIG. 9, for example, when the power supply voltage Vcc is 2.5 V and the base potential is 1.5 V, the potential of the output Vcp3 at the time when a normal operation is performed is smaller than the power supply voltage Vcc and larger than the base potential. To control the potential of the output Vcp3 within a range suitable for the normal operation irrespective of the input power (the input current Ipd), it is desirable to use the current adjustment circuit 50 as a current source on the emitter side.

In the current adjustment circuit 50, for example, resistors R1 and R11 disposed in parallel are used. A switching transistor T5 is connected to one resistor R11 in series. During the small power input, the switching transistor T5 is turned off to reduce the electric current Ie on the emitter side (the resistor on the emitter side is only the resistor R1). During the large power input, the switching transistor T5 is turned on and the resistors R1 and R11 are connected in parallel to increase the electric current on the emitter side. In the example illustrated in FIG. 9, an NMOS is used because the switching transistor T5 is near the ground. Therefore, the switching transistor T5 is turned off when a voltage applied to a gate is low (e.g., 0 V) and is turned on when the voltage applied to the gate is high (e.g., 2.5 V).

With this configuration, noise is reduced during the small power input and operation failure due to an excessive decrease in the potential of the output Vcp3 is reduced.

<Switch Control Based on an Input Power Monitor>

Figure 11:
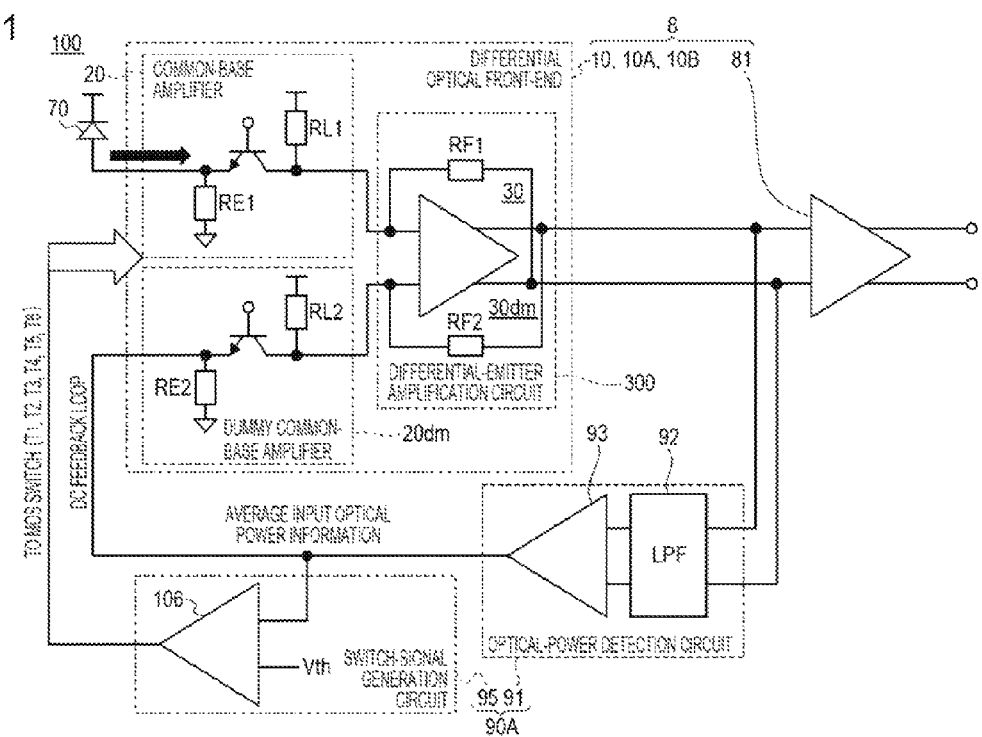
FIG. 11 is a diagram illustrating a configuration example of an optical receiving circuit including the frontend amplifier circuit according to the circuit configuration example 1 or 2.

FIG. 11 illustrates a configuration example of an optical receiving circuit 100 in the embodiment. In both of the frontend amplifier circuits 10A and 10B, ON/OFF operations of switching transistors T1 to T6 are controlled according to the magnitude of input power. The optical receiving circuit 100 has a configuration for monitoring the input power and generating a switch signal.

The optical receiving circuit 100 includes the photodiode 70, a frontend amplifier circuit 10 (the frontend amplifier circuit 10A illustrated in FIG. 7 or the frontend amplifier circuit 10B illustrated in FIG. 8), an output buffer circuit 81 functioning as a post-stage amplifier, an optical-power detection circuit 91, and a switch-signal generation circuit 95. The optical-power detection circuit 91 and the switch-signal generation circuit 95 are included in a switching circuit 90A. The frontend amplifier circuit 10 and the output buffer circuit 81 are included in a TIA 8.

A load RL1 of the common-base amplifier 20 of the frontend amplifier circuit 10 corresponds to the load 25 on the collector side illustrated in FIGS. 7 and 8. A load RE1 corresponds to the load R1 on the emitter side or the current adjustment circuit 50. The same applies to loads RL2 and RE2 of the dummy common-base amplifier 20dm. Feedback resistors RF1 and FR2 of a differential-emitter amplifier circuit 300 correspond to the feedback resistors Rf1 and Rf2 illustrated in FIGS. 7 and 8.

In the example illustrated in FIG. 11, the switching circuit 90A uses a part of a DC feedback loop for feeding back a direct current (DC) voltage of the TIA 8 to the frontend amplifier circuit 10. The optical-power detection circuit 91 of the switching circuit 90A includes a low-pass filter (LPF) 92 and a differential amplifier 93. The LPF 92 removes a high-frequency component of a differential output of the differential-emitter amplifier circuit 300 and averages the differential output. The differential amplifier 93 is connected to the feedback loop. Feedback is applied to an input current of the common-base amplifier 20 and an input current of the dummy common-base amplifier 20dm to be equalized. That is, an output of the differential amplifier 93 is output as average input optical power information. The average input optical power information is connected to a negative input of the dummy common-base amplifier 20dm.

A part of the average input optical power information is divided and connected to a first input of an operational amplifier 106 of the switch-signal generation circuit 95. A second input of the operational amplifier 106 is connected to a threshold voltage Vth. The average input optical power and the threshold voltage Vth are compared. When the average input optical power is larger than the threshold voltage Vth, for example, a high-potential switch signal is output and supplied to gates of the switching transistors T1 to T6 of the frontend amplifier circuit 10 (10A or 10B). When the average input optical power is equal to or smaller than the threshold voltage Vth, for example, a low-potential switch signal is output and supplied to the gates of the switching transistors T1 to T6. In this example, the operational amplifier 106 is used as a comparator. According to whether the switching transistors T1 to T6 are PMOS switches or NMOS switches, an inverter circuit that inverts an output as appropriate is inserted between the operational amplifier 106 and the switching transistors T1 to T6.

Figure 12:
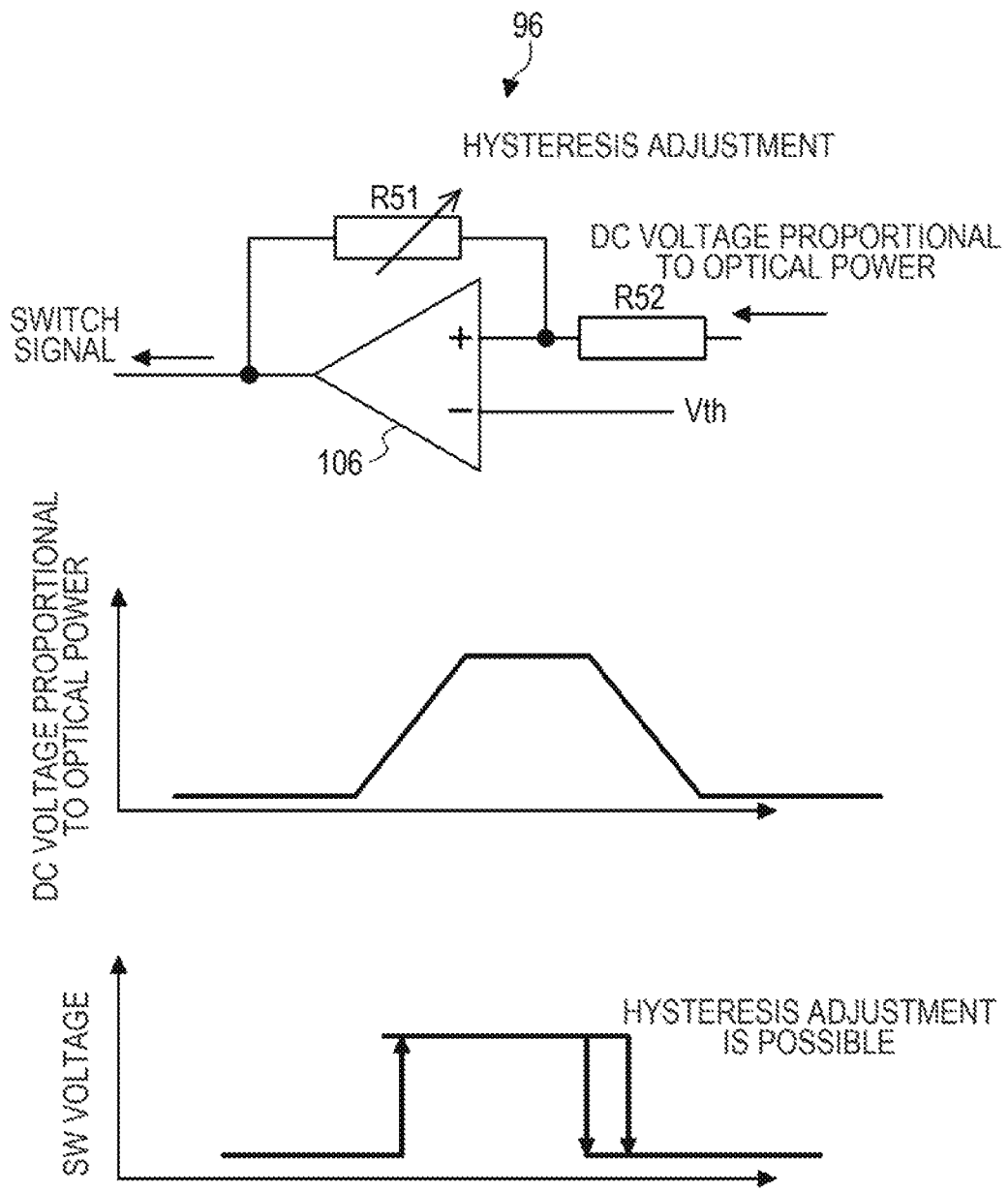
FIG. 12 is a diagram illustrating a modification of a switch-signal generation circuit used in the optical receiving circuit.

FIG. 12 illustrates, as a modification of the switch-signal generation circuit 95, a switch-signal generation circuit 96 that uses hysteresis adjustment. An output of the optical-power detection circuit 91, that is, a DC voltage proportional to the input optical power is connected to a first input of the operational amplifier 106 via a resistor R52. A second input of the operational amplifier 106 is connected to an inverting input of the threshold voltage Vth. An output of the operational amplifier 106 is fed back to the first input of the operational amplifier 106 via a variable resistance R51.

When a fluctuation component such as noise is included in the output of the optical-power detection circuit 91, the output of the operational amplifier 106 fluctuates and ON/OFF of the switch becomes unstable. For example, as illustrated in a middle part of FIG. 12, when the average input optical power (the DC voltage) gradually increases and exceeds the threshold voltage Vth, the output fluctuates near the threshold voltage Vth. Therefore, the switch signal is maintained at, for example, low potential until the average input optical power connected to the first input of the operational amplifier 106 further exceeds the threshold voltage Vth by a fixed level. When the average input optical power decreases to be smaller than the threshold voltage Vth, the switch signal is maintained at, for example, high potential until the average input optical power further decrease from the threshold voltage Vth by a fixed level. It depends on a resistance ratio of R11 and R12 until to which degree the average input optical power changes from the threshold voltage Vth the switching of the switch signal is maintained.

By adopting the configuration of the switch-signal generation circuit 96, it is possible to reduce fluctuation of the switch due to fluctuation in optical power.

Figure 13:
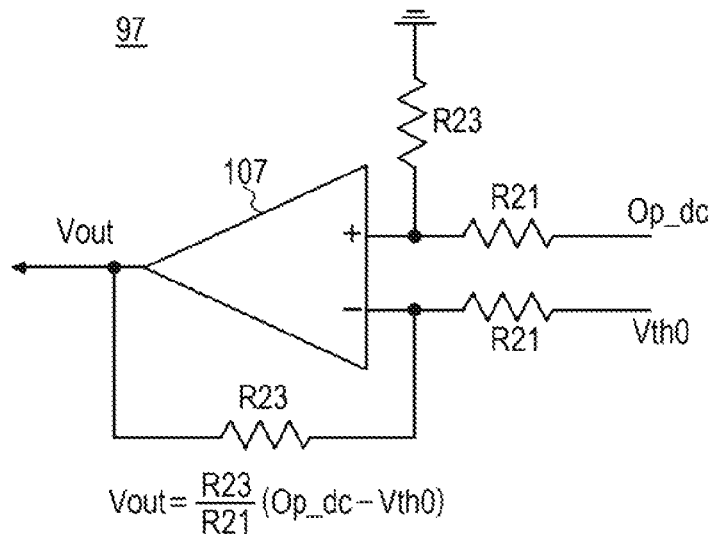
FIG. 13 is a diagram illustrating another modification of the switch-signal generation circuit used in the optical receiving circuit.

FIG. 13 illustrates, as still another modification of the switch-signal generation circuit 95, a switch-signal generation circuit 97 that generates an analog switch signal. By analogically changing the voltage of the switch signal rather than digitally, it is possible to obtain an effect same as the effect of the hysteresis adjustment illustrated in FIG. 12.

Figure 14A:
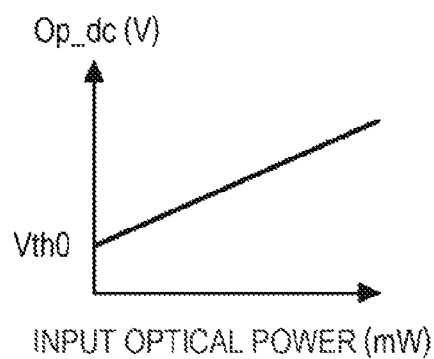
FIGS. 14A and 14B are diagrams illustrating a relation between input optical power and an output of an optical-power detection circuit and gradient control of a switch signal.

In the switch-signal generation circuit 97, an output voltage Op_dc of an optical-power detection circuit 91 is connected to a first input (a positive input) of an operational amplifier 107 via a resistor R21. As illustrated in FIG. 14A, the output voltage Op_dc of the optical-power detection circuit 91 is a DC voltage proportional to input optical power. The first input of the operational amplifier 107 is grounded via a resistor R23. A second input of the operational amplifier 107 is connected to an inverting input of a threshold voltage Vth0 via the resistor R21. An output of the operational amplifier 107 is fed back to the second input of the operational amplifier 107 via the resistor R23.

In this configuration, an output Vout of the operational amplifier 107 is represented by Vout=(R23/R21) (Op_dc−Vth0).

Figure 14B:
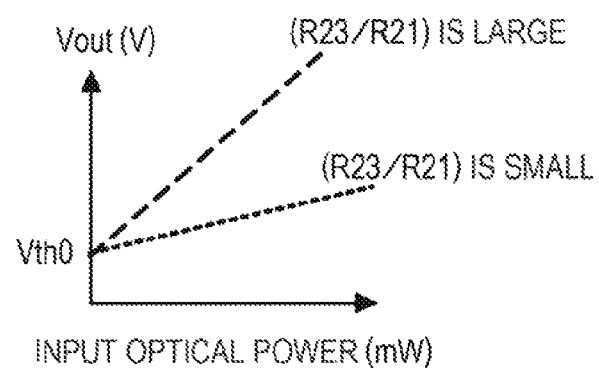

As illustrated in FIG. 14B, a gradient of an output voltage (a switch voltage) with respect to the input optical power may be adjusted by changing a ratio of the resistors R23 and R21. In this configuration, a switch signal corresponding to the input optical power is supplied to the switching transistors T1 to T6 of the frontend amplifier circuit 10. When a voltage of the switch signal exceeds a gate threshold voltage of the switching transistors T1 to T6, the switching transistors T1 to T6 become conductive.

With the configuration illustrated in FIG. 14, it is possible to reduce a phenomenon in which ON/OFF of the switch becomes unstable because of fluctuation in the intensity or the power of an optical signal.

Figure 15:
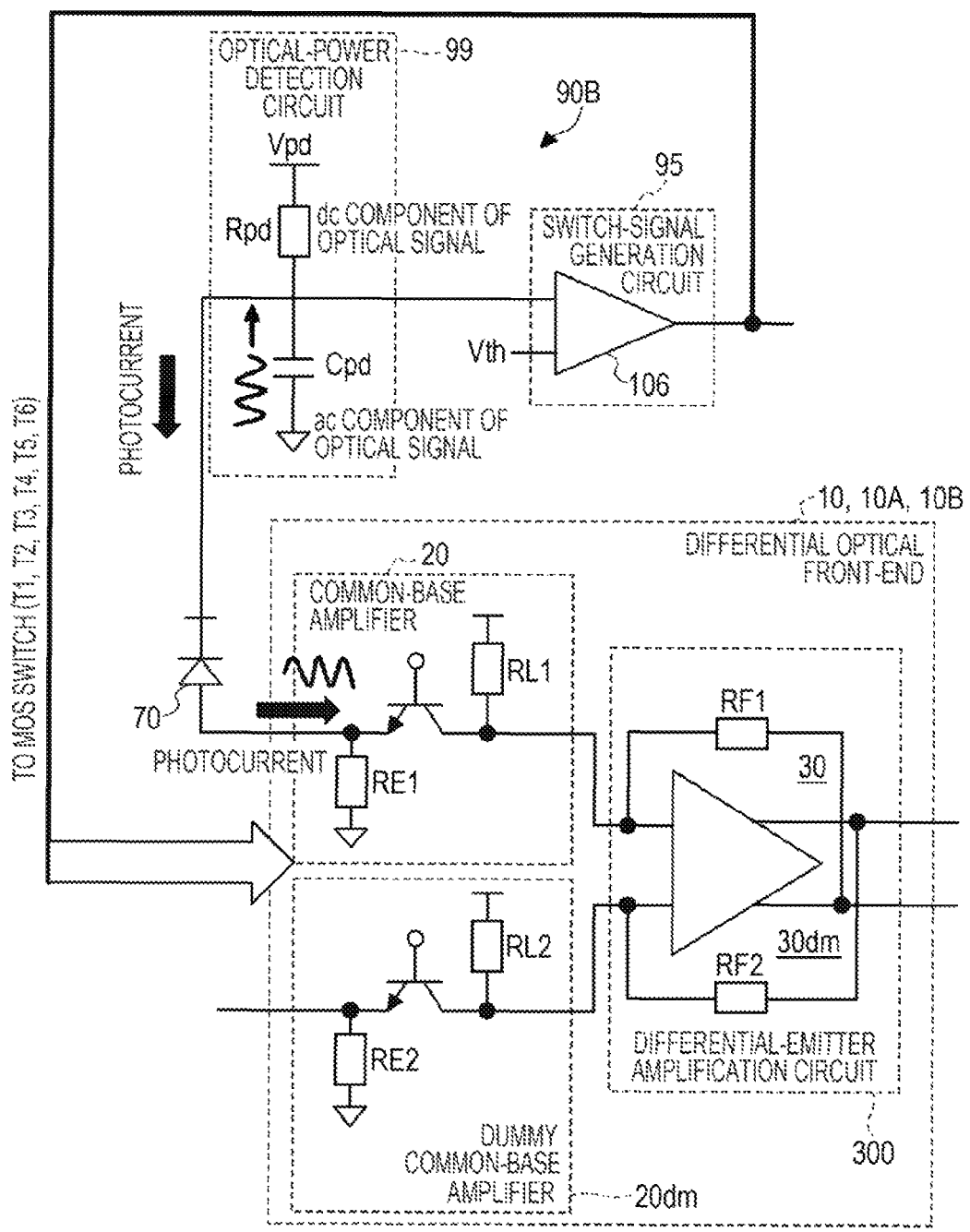
FIG. 15 is a diagram illustrating another configuration example of the optical receiving circuit.

FIG. 15 illustrates a configuration example of an optical receiving circuit 200 including a switching circuit 90B. In FIG. 15, an optical current is monitored on a cathode side of the photodiode 70 and a switch signal is generated. The switching circuit 90B includes an optical-power detection circuit 99 and a switch-signal generation circuit 95. The optical-power detection circuit 99 is connected to a cathode of the photodiode 70. In the optical-power detection circuit 99, an inverse bias voltage Vpd, a load Rpd, and a coupling capacitor Cpd are connected in series. The coupling capacitor Cpd removes an alternating current (AC) component of an optical signal and connects a DC component to the first input of the operational amplifier 106 of the switch-signal generation circuit 95. The threshold voltage Vth is connected to the second input of the operational amplifier 106. When a DC voltage of the optical signal is larger than the threshold voltage Vth, the operational amplifier 106 outputs, for example, a high-potential switch signal. When the DC voltage of the optical signal is equal to or smaller than the threshold voltage Vth, the operational amplifier 106 outputs, for example, a low-potential switch signal. The switch signal is input to the gates of the switching transistors T1 to T6 of the frontend amplifier circuit 10 (10A or 10B).

In the example illustrated in FIG. 15, the switch-signal generation circuit 95 same as the switch-signal generation circuit 95 illustrated in FIG. 11 is used. However, instead of the switch-signal generation circuit 95, the switch-signal generation circuit 96 capable of performing the hysteresis adjustment illustrated in FIG. 12 or the switch-signal generation circuit 97 that generates the analog switch signal illustrated in FIG. 13 may be used.

In both the cases, when the power of the input optical signal exceeds a predetermined level, the switching circuits 90A and 90B reduce the load resistance of the load 25 of the common-base amplifier 20 and increases the emitter current of the emitter common amplifier 30. Under this control, an output of the common-emitter amplifier 30 is fed back to the output Vcp3 of the common-base amplifier 20 to maintain an operation characteristic in a high-frequency band and reduce band narrowing.

Figure 16:
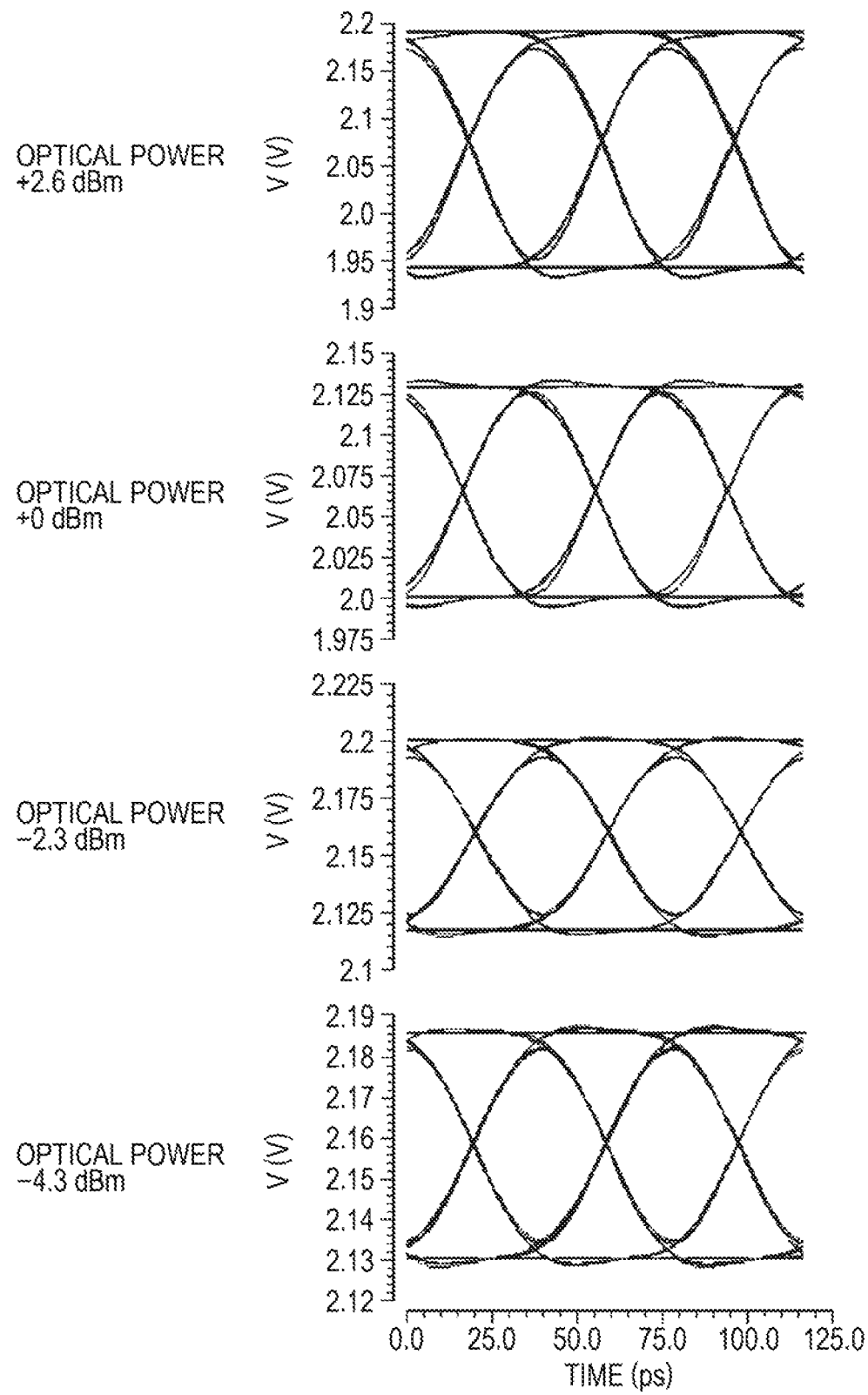
FIG. 16 is a diagram illustrating an effect of the optical receiving circuit in the embodiment.
Figure 17:
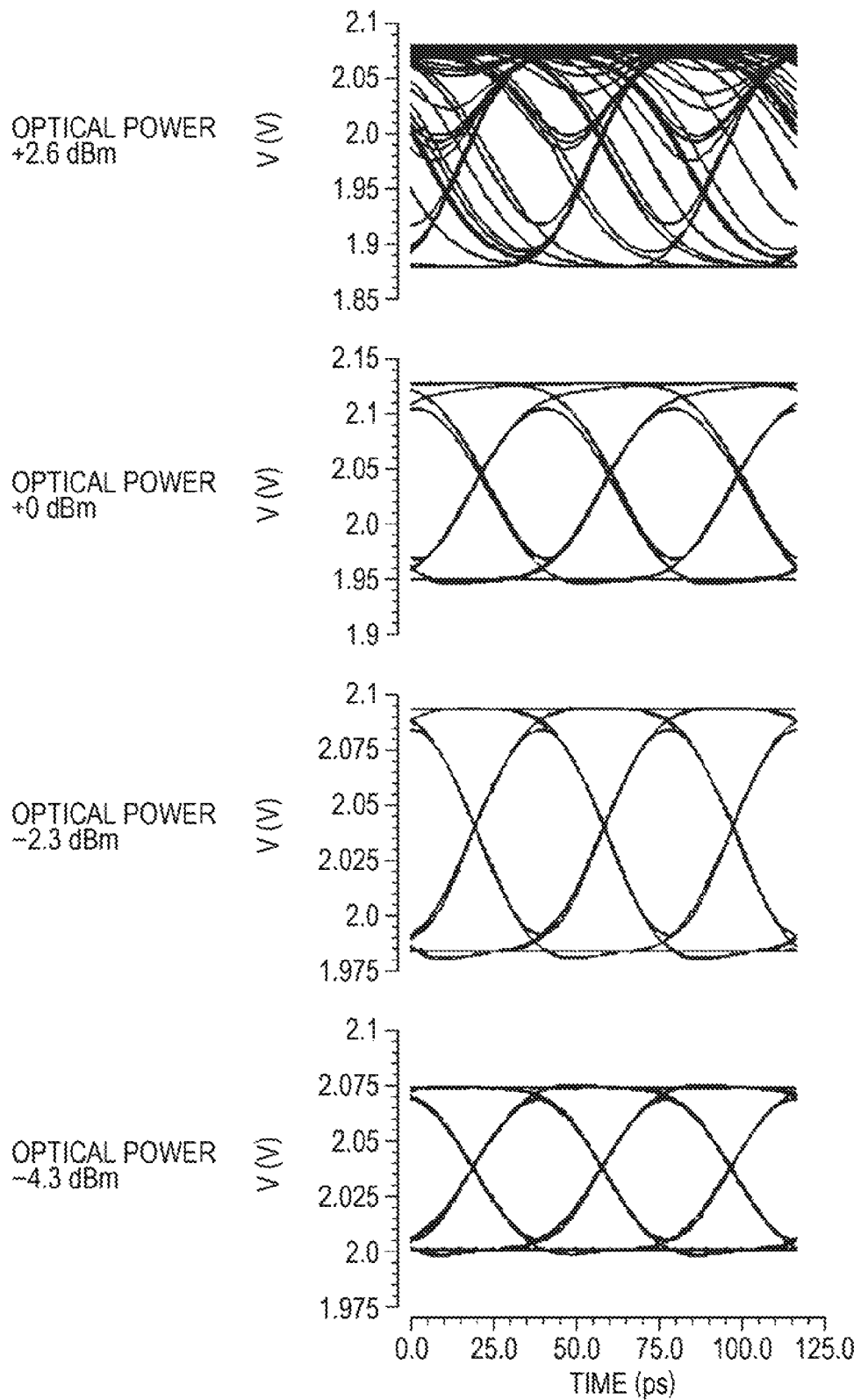
FIG. 17 is a diagram illustrating, as a comparative example, an eye pattern at the time when a configuration in the past is used.

When the power of the input optical signal is equal to or lower than the predetermined level, control for increasing the load resistance of the load 25 of the common-base amplifier 20 and reducing the emitter current of the common-emitter amplifier 30 is performed. According to this control, noise is effectively reduced during a small current when the influence of the noise increases. Further, during the small current, the electric current of the current source of the common-base amplifier 20 is reduced (the circuit configuration example 2) to reduce operation failure during the small current. FIG. 16 is a diagram illustrating an effect of the optical receiving circuit in the embodiment. FIG. 16 illustrates an eye pattern at the time when the frontend amplifier circuit 10B illustrated in FIG. 8 (the circuit configuration example 2) is used in the optical receiving circuit. FIG. 17 illustrates an eye pattern of the optical receiving circuit of the configuration in the past as a comparative example. In FIGS. 16 and 17, simulations are performed at an operation speed of 25.6 Gb/s. An extinction ratio of an input signal is 5 dB. This is a general value of a modulation signal generated using a VCSEL.

In the configuration in the past illustrated in FIG. 17, the common-base amplifier illustrated in FIG. 2 is used alone in a frontend amplifier circuit. When the load Rc on the collector side is used while keeping the resistance of the load R3 (800Ω), during a large signal, for example, when the average optical power is +2.6 dBm, an operation fails. By reducing the resistance of the load Rc on the collector side during the large signal (switched from 800Ω to 400Ω), it is possible to barely cope with the average optical power up to +2.6 dBm. However, since the load resistance is small, the reception sensitivity is very low as explained above.

On the other hand, in FIG. 16, the resistance of the load on the collector side of the common-base amplifier is reduced (switched from 800Ω to 400Ω) during the large signal and the emitter current of the common-emitter amplifier is increased to feed back the output of the common-emitter amplifier to the output Vcp3 of the common-base amplifier by negative feedback. Consequently, it is possible to obtain a clear eye pattern even when the optical power is +2.6 dBm.

In FIG. 16, the resistance of the load Rc on the collector side of the common-base amplifier is increased (switched to 800Ω) during the small signal, noise is reduced, and the electric current on the emitter side of the common-base amplifier is reduced to reduce operation failure during the small signal. Consequently, it is possible to obtain a clear eye pattern over an entire dynamic range. In FIG. 16, the reception sensitivity is improved by 1 dB compared with when the switching of the resistance of the load Rc is not used (the resistance of the load Rc is a fixed value of 400Ω).

Note that, when the frontend amplifier circuit 10A illustrated in FIG. 7 is used, an eye pattern same as the eye pattern illustrated in FIG. 16 is obtained by reducing the resistance of the load Rc on the collector side of the common-base amplifier (switched to 400Ω) during the large signal. At this point, the resistance of the load Rc may be increased to only 600Ω during the small signal because of a bottleneck during the small signal. However, the reception sensitivity is improved by 0.5 dBm compared with the reception sensitivity in FIG. 17.

As explained above, with the optical receiving circuit in the embodiment, it is possible to perform reception processing of an optical signal in a stable operation with excellent reception sensitivity irrespective of the magnitude of the input signal power. In the embodiment, the common-base amplifier 20 and the common-emitter amplifier 30 are formed using the bipolar transistors as the transistors Q1 to Q8. However, the same effect may be obtained when a gate-common amplifier and a common-source amplifier are formed using field effect transistors. It is assumed that the "common-base amplifier" referred to in claims includes the common-gate amplifier. The "common-emitter amplifier" referred to in claims includes the common-source amplifier. It is assumed that the "base" includes the gate, the "emitter" includes the source, and the "collector" includes the drain.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiment of the present invention has been described in detail, it should be understood that the various changes, substitutions, and alterations could be made hereto without departing from the spirit and scope of the invention.

What is claimed is:

1. An apparatus, comprising:
a photodiode configured to detect an optical signal;
a common-base amplifier configured to input a current signal converted from the optical signal by the photodiode;
a common-emitter amplifier configured to couple to an output of the common-base amplifier;
a first circuit configured to feed back the output of the common-emitter amplifier to an output of the common-base amplifier; and
a second circuit configured to, when power of the optical signal exceeds a predetermined level, reduce a load resistance value of the common-base amplifier and increase an emitter current of the common-emitter amplifier.

2. The apparatus according to claim 1, wherein
the second circuit is configured to, when the power of the optical signal exceeds the predetermined level, reduce the load resistance value of the common-base amplifier by a first switch and increase the emitter current of the common-emitter amplifier by a second switch.

3. An apparatus, comprising an optical receiver including:
a photodiode configured to detect an optical signal;
a common-base amplifier configured to input a current signal from the photodiode;
a common-emitter amplifier configured to couple to an output of the common-base amplifier;
a feedback circuit configured to feed back the output of the common-emitter amplifier to an output of the common-base amplifier; and
a switching circuit configured to switch, based on power of the optical signal, magnitude of load resistance of the common-base amplifier and magnitude of an emitter current of the common-emitter amplifier.

4. The apparatus according to claim 3, wherein
when the power of the optical signal exceeds a predetermined level, the switching circuit reduces the load resistance of the common-base amplifier and increases the emitter current of the common-emitter amplifier.

5. The apparatus according to claim 3, wherein
the common-base amplifier includes a current source, and
when the power of the optical signal is equal to or lower than the predetermined level, the switching circuit increases the load resistance of the common-base amplifier and reduces an electric current of the current source.

6. The apparatus according to claim 5, wherein, when the power of the optical signal exceeds the predetermined level, the switching circuit reduces the load resistance and increases the electric current of the current source.

7. The apparatus according to claim 3, wherein
the common-base amplifier includes a first load and a second load connected to a power supply voltage in parallel and a first switching transistor connected to one of the first load and the second load in series,
the common-emitter amplifier includes a first current source and a second current source which are connected in parallel to reference potential, and a second switching transistor connected in series to one of the first current source and the second current source, and
the switching circuit controls ON/OFF of the first switching transistor and the second switching transistor based on the power of the optical signal.

8. The apparatus according to claim 7, wherein
the switching circuit includes an optical-power detection circuit configured to monitor the power of the optical signal, and a switching-signal generation circuit configured to generate a switch signal based on an output of the optical-power detection circuit, and
the switch signal is connected to the first switching transistor and the second switching transistor.

9. The apparatus according to claim 3, wherein
the current source of the common-base amplifier includes a third load and a fourth load which are connected in parallel to reference potential, and a third switching transistor connected in series to one of the third load and the fourth load, and
the switching circuit controls ON/OFF of the third switching transistor.

10. The apparatus according to claim 3, wherein
the switching circuit includes an optical-power detection circuit configured to monitor the power of the optical signal, and a switch-signal generation circuit configured to generate a switch signal based on an output of the optical-power detection circuit, and the switch-signal generation circuit generates a digital switch signal, a switch signal with hysteresis adjusted, or an analog switch signal.

11. The apparatus according to claim 10, wherein the optical-power detection circuit is coupled to the output of the common-emitter amplifier and monitors the power of the optical signal.

12. The apparatus according to claim 10, wherein the optical-power detection circuit is connected to a cathode of the photodiode and monitors the power of the optical signal.

13. The apparatus according to claim 3, further comprising:

an optical transceiver; wherein the optical transceiver comprises the optical receiver and an optical transmitter.

14. A control method for an optical receiving circuit, comprising:

detecting power of an optical signal received by an optical receiving circuit;

when the power of the optical signal exceeds a predetermined level, reducing, by a first signal output from a circuit, load resistance of a common-base amplifier of the optical receiving circuit and increasing, by a second signal output from the circuit, an emitter current of a common-emitter amplifier connected to an output of the common-base amplifier; and feeding back an output of the common-emitter amplifier to the output of the common-base amplifier.

15. The control method for the optical receiving circuit according to claim 14, wherein a current source is disposed on a reference voltage side of the common-base amplifier, and the control method further comprises, when the power of the optical signal is equal to or lower than the predetermined level, increasing the load resistance of the common-base amplifier and reducing an electric current of the current source.

16. The control method for the optical receiving circuit according to claim 15, further comprising, when the power of the optical signal exceeds the predetermined level, reducing the load resistance and increasing the electric current of the current source.

* * * * *